United States Patent [19]

Sinniger

[11] 4,365,202

[45] Dec. 21, 1982

[54] DUTY CYCLE GENERATOR WITH IMPROVED RESOLUTION

[75] Inventor: Joseph O. Sinniger, Pennington, N.J.

[73] Assignee: RCA Corporation, New York, N.Y.

[21] Appl. No.: 180,903

[22] Filed: Aug. 25, 1980

[51] Int. Cl.³ .......................... H03K 5/05; H03K 7/08
[52] U.S. Cl. ........................................ 328/58; 328/48; 328/61
[58] Field of Search ....................... 328/58, 48, 69, 74, 328/61

[56] References Cited

U.S. PATENT DOCUMENTS

| | | | |
|---|---|---|---|
| 3,614,632 | 10/1971 | Leibowitz et al. | 328/58 |
| 3,629,710 | 12/1971 | Durland | 328/58 |
| 3,836,858 | 9/1974 | Kitano | 328/58 |
| 3,958,182 | 5/1976 | Sauthier | 328/58 |
| 4,141,376 | 2/1979 | Frey | 328/58 X |
| 4,166,247 | 8/1979 | Miyazawa | 328/58 X |
| 4,236,114 | 11/1980 | Sasaki | 328/58 |

Primary Examiner—John S. Heyman
Attorney, Agent, or Firm—Samuel Cohen; Joseph S. Tripoli; Donald W. Phillion

[57] ABSTRACT

A digitized duty cycle pulse generator capable of resolution finer than the period of the available source clock signal. The invention comprises a means for generating a clock pulse signal having a repetition of $f_c$, counter means responsive to said clock pulse signal to cycle iteratively through a count of n, and storage means for storing a variable binary value m, where m<n and m is the length of the desired duty cycle pulse, and where m/n is the duty cycle. Also provided are logic means comprising comparator means responsive to the instantaneous count l in said counter means and the value m in said storage means when m is not an integer to produce a first logic level signal when l<m and a second logic level signal when l>m during first selected cycles of said counter means through said count of n, and to produce said first logic level signal when l<(m+1) and said second logic level signal when l>(m+1) and during second selected cycles of said counter means through said count of n.

9 Claims, 4 Drawing Figures

| I | II | III | IV |
|---|---|---|---|
| F/F 54 OUTPUT | LSB 27 OUTPUT | AND GATE 43 OUTPUT | AND GATE 45 OUTPUT |
| A | 1 | 0 | 1 | 0 |
| B | 0 | 0 | 1 | 0 |
| C | 1 | 1 | 0 | 1 |
| D | 0 | 1 | 1 | 0 |

DUTY CYCLE GENERATOR WITH IMPROVED RESOLUTION

This invention relates generally to digitized duty cycle generators and more particularly to a digitized duty cycle generator with improved resolution.

A digitized duty cycle generator is a device that creates a periodic output signal of a first level and of variable length. Generally, in a duty cycle generator a counter having a given capacity is driven from a clock source. The output of the counter is constantly compared with the contents of a latch, which contents can be changed as desired to determine the desired pulse duration. When the contents of the counter are less than (or equal to) the contents of the latch, a comparator outputs a binary 0 and when the contents of the counter exceed the contents in the latch, the comparator outputs a binary 1. If a counter has 8 stages therein it will have a count capacity of 256. If the value in the latch is set at 10 then the comparator will produce a binary 1 during the time period extending from a count of 0 to a count of 10 in the counter and an output of binary 0 during the time period extending from the count of 11 to the count of 255. If the clock pulse rate is 1 MHz then the duration of a pulse generated at the output of the comparator is 10 times 1.0 microsecond or 10 microseconds.

The resolution of the duty cycle generator pulse is the ratio of 1 count (1 microsecond in the example) to the total number of counts comprising a duty cycle pulse which, in the above example, is 10 counts. Thus the resolution of the above-identified example is 10%. The sample rate of the duty cycle is the ratio of the 1 MHz clock frequency to the total number of counts possible, which equals $10^6/256$ samples/second. It is evident that the resolution cannot be less than one period of the clock frequency.

In certain applications it is desired to have the resolution of the duty cycle be finer (less than) one period of the clock frequency, particularly in those cases where the clock frequency is fixed and could only be increased at an unjustified cost. As an example, one application of duty cycles generated in the above manner is for the injection of fuel under electronic control into a gasoline engine. In such an application the fuel is injected into the carburetor at periodic intervals during the occurrence of the duty cycle pulses whose widths are increased or decreased in accordance with the fuel requirements of the engine. The clock frequency provided in some of these electronic fuel control systems is less than that required to obtain sufficiently precise control of the fuel injection. The cost of increasing the frequency of the clock signal to obtain a more precise fuel control injection is prohibitively high. The present invention provides a more precise fuel control by injection without changing the available clock frequency.

In accordance with a preferred form of the invention there is provided a means for generating a clock pulse signal having a repetition rate $f_c$, counter means responsive to said clock pulse signal to cycle iteratively through a count of n, and storage means for storing a variable binary value m, where $m < n$ and is the length of the desired duty cycle pulse, and where $m/n$ is the duty cycle. Also provided are logic means comprising comparator means responsive to the instantaneous count l in said counter means and the value m in said storage means when m is not an integer to produce a first logic level signal when $1 < m$ and a second logic level output signal when $1 > m$ during first selected cycles of said counter means through count of n, and to produce said first logic level signal when $1 < (m+1)$ and said second logic level signal when $1 > (m+1)$ during second selected cycles of said counter means through said count of n.

Figures 1, 2A:
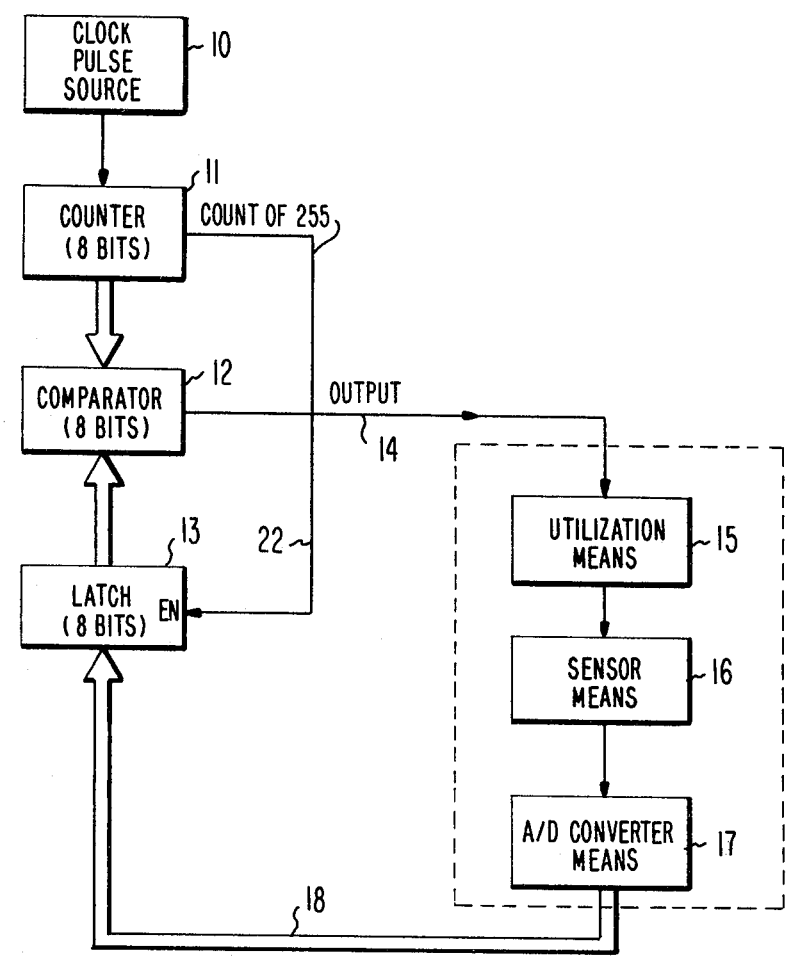
FIG. 1 is a block diagram of a prior art device wherein the resolution of the duty cycle pulse is equal to the period of the clock pulse source.
FIG. 2a is a truth table of FIG. 2.
Figure 2:
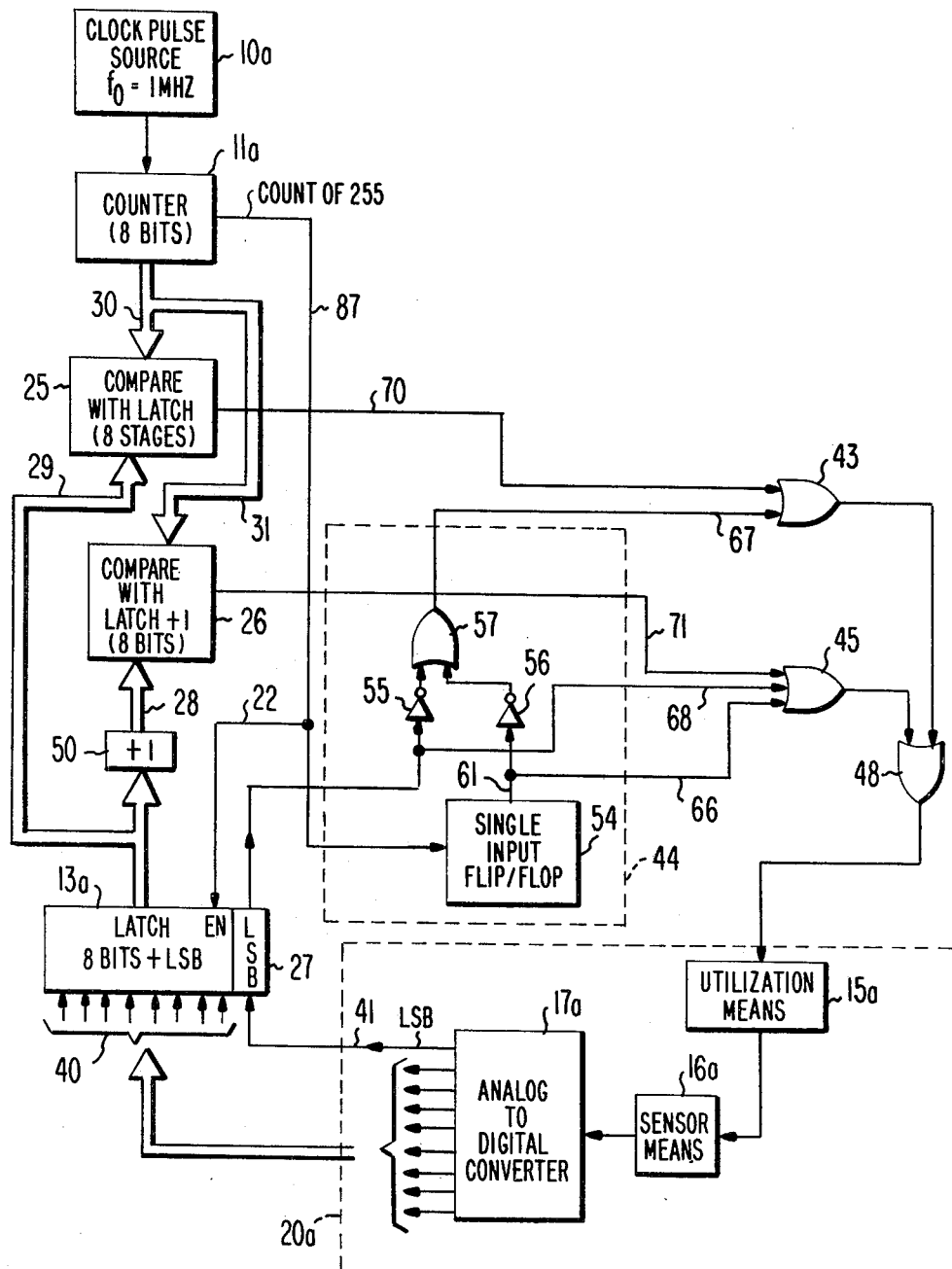
FIG. 2 is a block diagram of one form of the invention wherein the resolution is equal to one-half the period of a clock pulse cycle.
Figure 3:
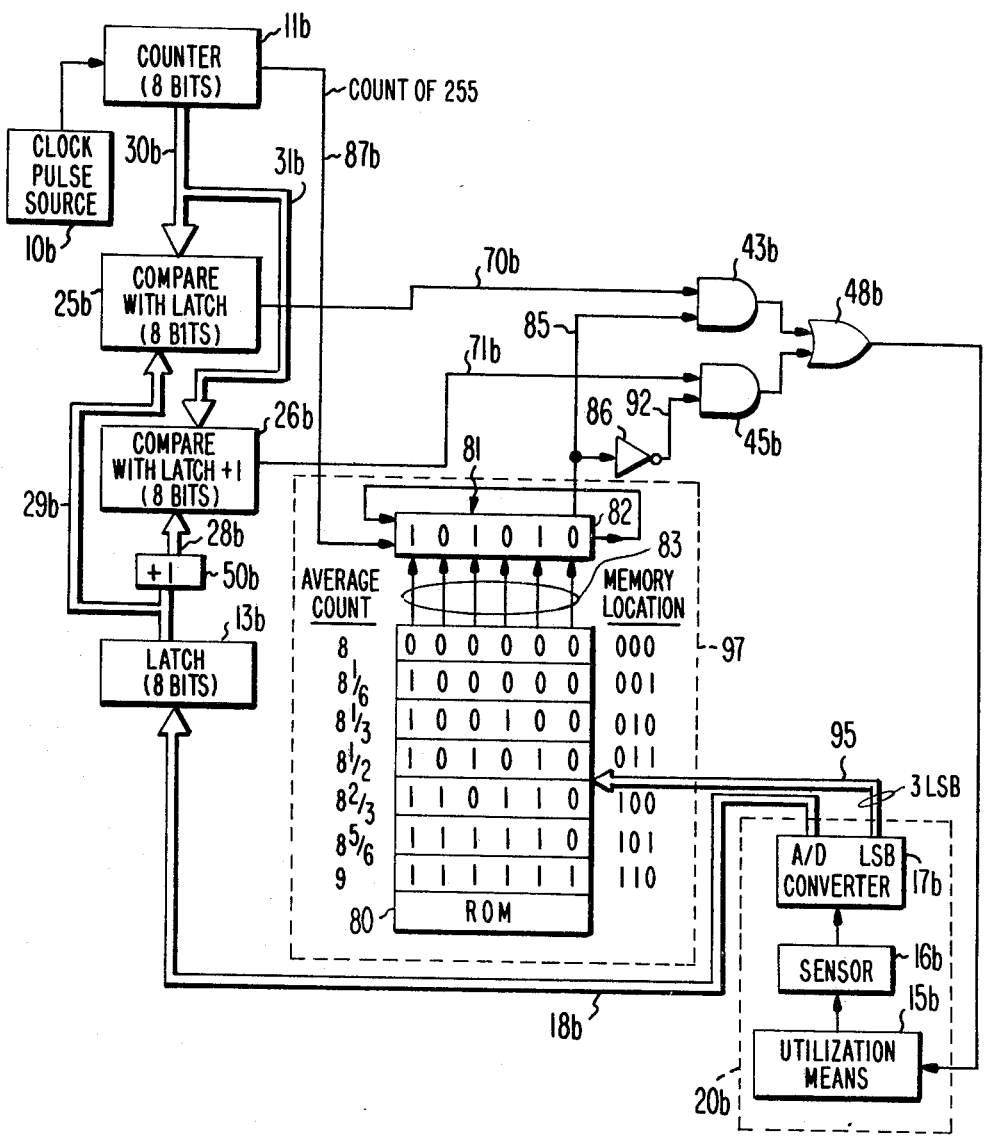
FIG. 3 is a block diagram of another form of the invention wherein the resolution is equal to one-sixth of the period of the clock pulse source.

In FIG. 2 those elements which correspond either precisely or generally to elements of FIG. 1 are identified by the same reference followed by the letter "a". In FIG. 3 the elements thereof which correspond precisely or generally to elements of FIG. 1 of FIG. 2 are identified by the same reference character followed by the letter "b".

In FIG. 1 assume that the clock pulse source 10 supplies a train of clock pulses at 1 MHz rate to the 8 bit counter 11. The 8 bit counter 11 counts repeatedly from 0 to 225 in response to the clock pulses from source 10. An 8 bit latch 13 can have any binary value from 0 to 255 stored therein, such binary value usually being determined in response to the output of the device being controlled. Such device is designated generally by dotted block 20 and comprises utilization means 15, a sensor 16, and an analog-to-digital (A/D) convertor 17.

An 8 bit comparator 12 is constructed to output a binary 1 when the contents of counter 11 is equal to or less than the contents of latch 13 and to output a binary 0 when the contents of counter 11 is greater than that of latch 13. Thus, the output signal appearing on output lead 14 is a two level signal whose resolution is equal to the period of clock pulse source 10. Specifically, in the example discussed above, the signal on lead 14 is high, a binary 1, during the count of 0 to 10 in counter 11 and is low, a binary 0, during the count interval of 11 through 255 of counter 11.

In one application, utilization means 15 responds to the high level signal on output lead 14 to supply an injection of fuel into a carburetor. A sensor means 16 responds to the operation of the engine by suitable structure, not shown in FIG. 1, to supply an analog signal to A/D converter means 17, indicating that a greater or lesser duty cycle is required in order to maintain the operation of the engine in accordance with some desired parameters.

A/D converter means 17 converts the analog output of sensor means 16 to change the value in latch 13 at the end of each cycle of counter 11, if such a change is in fact required by the system. The output A/D converter means 17 is clocked into latch 13 by the end-of-cycle count 255 from counter 11 via lead 22.

Referring now to FIG. 2 there is shown a form of the invention in which the resolution of the duty cycle can be improved by a factor of two with the same clock pulse source of 1 MHz. In general the logic of FIG. 2 obtains such improved resolution by, in essence, having alternate lengths of duty cycles. More specifically, to obtain a duty cycle length of 10.5 with a resolution of ½ clock pulse period the counter 11a will count alternately to 10 and 11 so that the average count of the duty cycle is 10.5.

The foregoing is implemented by employing two comparators 25 and 26 which alternately will compare the contents of latch 13a with the count in counter 11a over successive complete cycles of counter 11a. The comparator 25 of FIG. 2 performs exactly the same function as the comparator 12 in FIG. 1. The comparator 26 of FIG. 2, however, compares the contents of latch 13a plus a value 1 so that in effect the generated duty cycle is 11 counts, assuming that the latch 13a has a 10 stored therein.

In FIG. 2 an 8 bit word is supplied from A/D converter 17a within dotted block 20a to the 8 most significant bit positions 40 of a nine stage latch 13a. The contents of the least significant bit (LSB) position of A/D converter 17a is applied to the least significant bit (LSB) position 27 of latch 13a. If the contents of latch 13a is an integer such as 10, 11, or 15 then the contents of the least significant bit position 27 is 0 and the circuit functions in essentially the same manner as the circuit of FIG. 1 in that the contents of the 8 most significant bit positions of latch 13a are compared with the contents of 8 bit counter 11a in 8 stage comparator 25, the output thereof being supplied to utilization means 15a through AND gate 43 which is primed by means to be discussed later, and through OR gate 48.

Assume, however, that latch 13a contains a value half way between two integers, as for example 10.5. Under such conditions the least significant position 27 will contain a binary 1 representing 0.5 value in the 10.5 total value contained in latch 13a. The logic within the dotted block 44 responds to a binary 1 in the least significant bit position 27 of latch 13a to alternately prime AND gates 43 and 45 with each complete count cycle of counter 11a.

When AND gate 43 is primed, as discussed above, the output of comparator 25 will supply a duty cycle pulse of 10 counts therethrough and then through OR gate 48 to utilization means 15a. During the next duty cycle of counter 11a, however, AND gate 45 will be primed and AND gate 43 will be disabled by means of the logic within block 44 so that comparator 26 will supply a duty cycle pulse through AND gate 45 and OR gate 48 to utilization means 15a. However, comparator 26 in combination with the +1 adder 50 functions to compare the contents of latch 13a plus an additional binary 1 with the contents of counter 11a. Thus the actual comparison with the contents of counter 11a is a valve 11, comprised of the value stored in latch 13 and the 1 added thereto by adding means 50. Consequently, the output of comparator 26 is measured by a count of 11 in counter 11a. Thus the two aforementioned successive duty cycle pulses respectively have a length of 10 counts and a length of 11 counts which, when averaged together, produces an average count of 10.5, the desired duty cycle period.

The logic within the dotted block 44 consists of single input flip-flop 54, INVERTERS 55 and 56, and OR gate 57. The flip flop 54 changes its state at every 255th count of counter 11a via lead 87 to alternately prime AND gates 43 and 45 in a manner to be discussed in detail later herein. Since AND gates 43 and 45 are alternately enabled with each successive cycling of counter 11a to alternately supply the contents of comparators 25 and 26 through OR gate 48 to utilization means 15a, the initial state of flip flop 54 is irrelevant.

When the LSB 27 contains a binary 0, indicating an integer in latch 13a such 0 is inverted to a binary 1 in INVERTER 55 and then supplied through OR gate 57 to prime AND gate 43, thereby permitting the output of comparator 25 to be supplied through AND gate 43 and OR gate 48 to utilization means 15a, regardless of the state flip flop 54. At the same time the binary content of LSB 27 is supplied to one input 68 of AND gate 45 to disable said AND gate 45 and thereby prevent the output of comparator 26 from being supplied therethrough and through OR gate 48 to utilization means 15a.

On the other hand when LSB 27 contains a binary 1 the output of inverter 55 is a binary 0 and the input signal to input lead 68 of AND gate 45 is a binary 1, thereby priming AND gate 45. Thus the conductivity of AND gate 43 and 45 will depend on the signal logic level on input leads 67 and 66 thereof, respectively. Worded in another way when LSB 27 is a 1 the alternate enablement and disablement of AND gates 43 and 45 will depend on the output signal level appearing on output lead 61 of single input flip-flop 54. If the signal on output lead 61 is a binary 1 then AND gate 45 is primed and AND gate 43 is disabled by virtue of the binary 1 on lead 61 being inverted in INVERTER 56. On the other hand if a binary 0 is present on output lead 61 of flip-flop 54 AND gate 45 is disabled and AND gate 43 is enabled since the binary 0 is inverted to a binary 1 by the INVERTERS 56 and supplied to input 67 of AND gate 43 through OR gate 57.

As discussed above, when AND gate 43 is enabled, the output of comparator 25 is supplied via lead 70 to AND gate 43 and OR gate 48 to utilization means 15a. When AND gate 45 is enabled the output of comparator 26 is supplied via lead 71 to AND gate 45 and OR gate 48 to utilization means 15a.

The truth table of FIG. 2A shows the foregoing relationships. Such truth table has 4 vertical columns identified as vertical columns I, II, III, and IV and showing the status of AND gates 43 and 45 in response to the status of flip-flop 54 and LSB 27. The four rows of the truth table, identified as rows A, B, C, and D, show different states of flip-flop 54 and LSB 27.

In rows A and B LSB 27 of FIG. 2 contains a binary 0. Under these conditions the output of flip-flop 54 is immaterial as discussed above. The AND gate 43 remains energized with either state of flip-flop 54 and the AND gate 45 remains disabled with either state of flip-flop 54.

However, as shown in rows C and D, when LSB 27 of FIG. 2 contains a binary 1 AND gates 43 and 45 will alternately change levels as the output of flip-flop 54 changes level. It is to be understood that the output of flip-flop 54 changes levels in response to the count of 255 in counter 11a as discussed above.

In FIG. 3 there is shown another form of the invention enabling finer increments of average counts between adjacent interval counts. Much of the structure of FIG. 3 is similar to that of FIG. 2. Corresponding elements of FIG. 3 are identified by the same numeric reference character as the corresponding elements of FIG. 2 followed by the letter "b".

The new elements added to FIG. 3 that are not present in FIG. 2 include shift register 81 and ROM 80. ROM 80 is shown as having 7 memory word locations 000 through 110 with the least significant bit being at the right hand side of the expressed value. The contents of each of the 7 word locations range from 6 binary 0's to 6 binary 1's with gradation of the ratio of 1's to 0's increasing from memory locations 000 to memory locations 110.

The particular ratio of 1's to 0's and the positions of the 1's in the six bit words are selected so that the 1's occur in periodic fashion as nearly as possible.

Each of the 6 binary words in ROM 80 can be selectively entered in parallel into the 6 stage shift register 81 via the six leads 83 and in response to the addressing contents of the 3 least significant bit positions, of A/D converter 17b, which contents are supplied to ROM 80 via the three leads 95. The contents of each particular memory locations addressed by leads 95 are transferred to shift register 81 when the address of such particular memory location is supplied from A/C converter 17b.

As an example, at the left hand side of ROM 80, in a column headed by the term "AVERAGE COUNT", there is shown a list of numbers ranging from 8 to 9 in gradations of 1/6. These average count values represent the average count of the output of duty cycle pulse from comparators 25b and 26b over six of such selectable duty cycle pulse periods.

The contents of a selected word location, as mentioned above, is transferred into the shift register 81 and is then shifted 1 position at each count of 255 of counter 11b. The contents of the last bit position 82 of shift register 81 is employed to energize AND gates 43b and 45b in alternate manner. If the contents of the last bit position 82 of shift register 81 is a 0 then AND gate 45b will be primed and AND gate 43b will be disabled. On the other hand if the contents of the last stage 82 of shift register 81 is a binary 1 then AND gate 43b will be enabled and AND gate 45b will be disabled due to the inversion of the binary 1 to a binary 0 by INVERTER 86.

It can be seen that with the particular binary word 101010 contained in shift register 81, having been entered therein from address memory location 011 of ROM 80, AND gates 43b and 45b will be alternately enabled so that the duty cycle pulse rate will alternately consist of 8 counts and 9 counts of counter 11b in successive complete cycles of counter 11b.

Thus the average count of the duty cycle will be 8.5. If the output of A/D converter 17b were to access memory location 101 and transfer the binary contents 111110 therein to shift register 81 then there would be 5 successive pulse duty cycles having 9 counts generated in compare logic 26b followed by 1 of duty cycle of 8 counts generated in compare logic 25b. The average count would be 8 5/6 counts as indicated in the average count column to the left of ROM 80 opposite address 101.

The output of shift register 81 is supplied back to the input thereof via lead 83, and is therefor defined as a rotatable shift register, so that the selected ratio of counts of 9 and 8 will continue until changed by a change in the output of A/D converter 17b to select a different memory location of ROM 80.

I claim:

1. A digitized duty cycle pulse generator comprising:
    means for generating a clock pulse signal having a repetition rate $f_c$;
    counter means responsive to said clock pulse signal to cycle iteratively through a count of n;
    storage means for storing a variable binary value m where m<n, where m can have a fractional value, and where m/n is the pulse duty cycle; and
    logic means comprising comparator means responsive to the instantaneous count 1 in said counter means and the value m in said storage means when m is not an integer to produce a first logic level signal when 1<m and a second logic level output signal when 1>m during first selected cycles of said counter means through said count of n;
    said logic means and said comparator means being further responsive to the instantaneous count 1 in said counter means and the value (m+1) when m is not an integer to produce said first logic level signal when 1<(m+1) and said second logic level signal when 1>(m+1) during second selected cycles of said counter means through said count of n, and where said first and second selected cycles of said counter means are interleaved in a predetermined pattern.

2. A pulse generator as in claim 1 in which said logic means and said comparator means further comprise:
    first signal comparing means responsive to the condition 1<m to produce said first logic level signal and to the condition 1>m to produce said second logic level signal; and
    second signal comparing means responsive to the condition 1<(m+1) to produce said first logic level signal and to the condition 1>(m+1) to produce said second logic level signal.

3. A pulse generator as in claim 2 in which said logic means further comprises:
    memory means having x memory locations with each memory location containing a digitized y bit word of a selected predetermined pattern of binary 1's and binary 0's;
    rotatable shift register means;
    means for entering selected ones of said digitized words into said rotatable shift register means;
    said shift register means responsive to each cycle of said counter means to advance the digitized word stored therein one bit;
    utilization means for utilizing said duty cycle pulse; and
    gating means responsive to the presence of a binary 1 or a binary 0 in a selected stage of said shift register means to gate the contents of said first or second signal comparing means to said utilization means.

4. A pulse generator as in claim 2 and further comprising:
    utilization means responsive to said first logic levels to exhibit certain operating characteristics;
    sensing means responsive to said operating characteristics to produce a series of sensing signals individually indicative of the length of the current pulse duty cycle required by said utilization means;
    means responsive to said sensing signals for selectively generating one of a plurality of predetermined patterns of binary 1's and 0's; gating means responsive to a binary 1 or a binary 0 in a selected one of said patterns to supply the logic level signals produced by said first or second signal comparing means, respectively, to said utilization means.

5. A digitized duty cycle generator comprising:
    first means for generating a clock pulse signal having a repetition rate $f_c$;
    counter means responsive to said clock pulse signal to cycle iteratively through a count of n;
    storage means for storing a binary value m where m<n, where m/n is the duty cycle, and where m has a variable value; and
    logic means comprising comparator means responsive to the instantaneous count of 1 in said counter means and the value m in said storage means when m is not an integer to produce a first logic level output signal when $1<m$ and a second logic level output signal when $1>m$ during first selected cycles of said counter means through said count of n;

said logic means comprising said comparator means being further responsive to the instantaneous count 1 in said counter means and the value (m+1) when m is not an integer to produce said first logic level when $1<(m+1)$ and said second logic level when $1>(m+1)$ during second selected cycles of said counter means through said count of n;

said logic means further responsive to the count 1 in said counter means and to the value m to produce said first logic level signal when $1 \leq m$ and said second logic level signal when $1>m$ during all cycles of said counter means through said count of n when m is an integer.

6. A pulse generator as in claim 5 in which said comparator means comprises:

first signal comparing means responsive to the condition $1<m$ to produce said first logic level signal and to the condition $1>m$ to produce said second logic level signal; and second signal comparing means responsive to the condition $1<m+1$ to produce said first logic level signal and to the condition $1>m+1$ to produce second logic level signal.

7. A pulse generator as in claim 6 and further comprising:

utilization means responsive to said pulse duty cycles to exhibit certain operating characteristics;

sensing means responsive to said operating characteristics to produce a series of sensing signals individually indicative of the length of the current pulse duty cycle required by said utilization means;

second means responsive to said sensing signal for selectively generating a selectable one of a plurality of serial trains of predetermined patterns of binary 1's and 0's;

gating means responsive to binary 1's or binary 0's in a selected one of said predetermined patterns of binary 1's and 0's to supply said logic level signals produced by said first or second signal comparing means, respectively, to said utilization means.

8. A pulse generator as in claim 7 in which said logic means further comprising:

memory means having x memory locations with each memory location containing one of said predetermined patterns of binary 1's and 0's;

rotatable shift register means; and means for entering selected ones of said predetermined patterns into said rotatable shift register means;

said shift register means responsive to each cycle of said counter means to advance said predetermined pattern of binary 1's and 0's therein one bit.

9. A method for generating a digitized duty cycle pulse comprising the steps of:

generating a clock pulse signal having a repetition rate $f_c$;

counting said clock pulse signals in iterative cycles through a count of n;

storing a variable binary value m where $m<n$, where m/n is the pulse duty cycle;

comparing an instantaneous count 1 and the stored value m when m is not an integer to produce a first logic level signal when $1<m$ and a second logic level output signal when $1>m$ during first selected cycles of said count through said count of n;

comparing an instantaneous count 1 and a stored value (m+1) when m is not an integer to produce said first logic level signal when $1<(m+1)$ and said second logic level signal when $1>(m+1)$ during second selected cycles of said count through said count of n; and supplying said first and second logic levels produced during said first and second cycles to a utilization means.

* * * * *

UNITED STATES PATENT AND TRADEMARK OFFICE
CERTIFICATE OF CORRECTION

PATENT NO. : 4,365,202

DATED : December 21, 1982

INVENTOR(S): Joseph O. Sinniger

It is certified that error appears in the above-identified patent and that said Letters Patent is hereby corrected as shown below:

Column 1, line 66, "1" should be --$\ell$--.
" , line 68, "1" should be --$\ell$--.
Column 2, line 1, "1" should be --$\ell$--.
" , line 4, "1" should be --$\ell$--.
" , line 22, "of" (second occurrence) should be --or--.
Column 5, line 14, "A/C" should be --A/D--.
" , line 68, "1" should be --$\ell$--.
Column 6, line 3, "1" should be --$\ell$--.
" , line 4, "1" should be --$\ell$--.
" , line 7, "1" should be --$\ell$--.
" , line 10, "1" should be --$\ell$--.
" , line 11, "1" should be --$\ell$--.
" , line 19, "1" should be --$\ell$--.
" , line 20, "1" should be --$\ell$--.
" , line 23, "1" should be --$\ell$--.
" , line 24, "1" should be --$\ell$--.
" , line 68, "1" should be --$\ell$--.
Column 7, line 3, "1" should be --$\ell$--.
" , line 4, "1" should be --$\ell$--.
" , line 8, "1" should be --$\ell$--.
" , line 10, "1" should be --$\ell$--.
" , line 11, "1" should be --$\ell$--.

UNITED STATES PATENT AND TRADEMARK OFFICE
CERTIFICATE OF CORRECTION

PATENT NO. : 4,365,202

DATED : December 21, 1982

INVENTOR(S): Joseph O. Sinniger

It is certified that error appears in the above-identified patent and that said Letters Patent is hereby corrected as shown below:

Column 7, line 13, "1" should be --$\ell$--.

" , line 15, "1" should be --$\ell$--.

" , line 16, "1" should be --$\ell$--.

" , line 22, "1" should be --$\ell$--.

" , line 23, "1" should be --$\ell$--.

" , line 26, "1" should be --$\ell$--.

" , line 27, "1" should be --$\ell$--.

Column 8, line 26, "1" should be --$\ell$--.

" , line 28, "1" should be --$\ell$--.

" , line 29, "1" should be --$\ell$--.

" , line 31, "1" should be --$\ell$--.

" , line 33, "1" should be --$\ell$--.

" , line 34, "1" should be --$\ell$--.

Signed and Sealed this

Thirty-first Day of May 1983

[SEAL]

Attest:

DONALD J. QUIGG

Attesting Officer  Acting Commissioner of Patents and Trademarks